(12) United States Patent
Morii

(10) Patent No.: US 7,244,517 B2
(45) Date of Patent: Jul. 17, 2007

(54) ORGANIC ELECTRO-LUMINESCENCE APPARATUS AND ELECTRONIC EQUIPMENT

(75) Inventor: Katsuyuki Morii, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 288 days.

(21) Appl. No.: 10/978,381

(22) Filed: Nov. 2, 2004

(65) Prior Publication Data

US 2005/0118457 A1 Jun. 2, 2005

(30) Foreign Application Priority Data

Nov. 7, 2003 (JP) .............................. 2003-378145

(51) Int. Cl.
*H01L 51/50* (2006.01)
*H05B 33/14* (2006.01)

(52) U.S. Cl. ...................... 428/690; 428/917; 313/504; 313/506

(58) Field of Classification Search ................ 428/690, 428/917; 313/504, 506, 509
See application file for complete search history.

(56) References Cited

U.S. PATENT DOCUMENTS

| | | | |
|---|---|---|---|
| 5,670,207 A | 9/1997 | Nire et al. | |
| 5,773,130 A * | 6/1998 | So et al. | ................... 428/195.1 |
| 5,846,666 A * | 12/1998 | Hu et al. | ................... 428/690 |
| 6,166,488 A | 12/2000 | Arai | |
| 6,269,954 B1 | 8/2001 | Baltzer | |
| 6,437,373 B1 | 8/2002 | Sakai et al. | |
| 2006/0145603 A1 * | 7/2006 | Taniguchi et al. | .......... 313/506 |

FOREIGN PATENT DOCUMENTS

JP A-2003-298152 A 10/2003

OTHER PUBLICATIONS

C.W. Tang et al., "Organic Electroluminescent Diodes", *Research Laboratories, Corporate Research Group, Eastman Kodak Company*, pp. 913-915, Jul. 20, 1987.
J.C. Carter et al., "Operating Stability of Light-Emitting Polymer Diodes Based On Poly(P-Phenylene Vinylene)", *Cambridge Display Technology Ltd.*, pp. 34-36, May 6, 1997.
G. Gustafsson et al., "Flexible Light-Emitting Diodes Made From Soluble Conducting Polymers", *Letters to Nature*, vol. 357, pp. 477-479, Jun. 11, 1992.

* cited by examiner

*Primary Examiner*—Rena Dye
*Assistant Examiner*—Camie S. Thompson
(74) *Attorney, Agent, or Firm*—Oliff & Berridge, PLC

(57) ABSTRACT

Aspects of the invention can provide an organic electroluminescence apparatus which has accomplished the light-emitting characteristics of high efficiency and long life and in which gradation control is facilitated, and electronic equipment provided with the electro luminescence apparatus. The organic electro-luminescence apparatus can include light-emitting functional sections formed between electrodes, the light-emitting functional sections being provided with a plurality of functional layers, the plurality of functional layers being formed only through phase separation.

21 Claims, 7 Drawing Sheets

(a)

(b)

(c)

ORGANIC ELECTRO-LUMINESCENCE APPARATUS AND ELECTRONIC EQUIPMENT

BACKGROUND OF THE INVENTION

1. Field of Invention

Aspects of the invention can relate to an organic electro-luminescence apparatus and electronic equipment.

2. Description of Related Art

Related art organic electro-luminescence apparatus can use an organic matter (Organic EL) as a self light-emitting display unit replacing a liquid crystal display unit. As related art methods of fabricating such organic EL apparatus, there have been proposed a method of forming small molecules by a vapor method, such as vacuum evaporation method, and a method of forming polymers by a wet process. See, for example, Appl. Phys. Lett. 51(12), 21 Sep. 1987, p, 913 and Appl. Phys. Lett. 71(1), 7 Jul. 1997, p, 34.

Further, in a related art structure of the organic EL apparatus, to improve efficiency and long life, a hole injection/transport layer (Hole Transport Layer) is often formed between an anode and a light-emitting layer. For methods of forming such hole transport layer and the like and a buffer layer, there have been proposed, in a case of using a small molecule material, a method of forming a phenylamine derivative by vapor evaporation, and in a case of using a polymer material, a method of forming a film of a conductive polymer such as polythiophene derivative or a polyaniline derivative by means of a coating process, such as a spin coat method. See, for example, Nature, 357, 477 1992.

SUMMARY OF THE INVENTION

Now, in regard to the related art organic EL apparatus described above there are several problems. As the multi-layered structure, a typical structure is one in which the hole transport layer, the light-emitting layer, and an electron transport layer are stacked in order, and further, at each layer, a film thickness, a film thickness ratio, and a multi-layered structure are determined by carrier mobility. For example, in a case of the hole transport layer, by the carrier mobility of a hole, and in a case of the light-emitting layer and the electron transport layer, by the carrier mobility of an electron, the thickness of each layer is determined, and the hole and the electron are arranged to be moved to the light-emitting layer in a proper balance.

Nonetheless, since a balance of the carrier mobility is achieved by multi-layering such structure, for example, if the film thickness of the hole transport material is thick, a voltage is set high, so that there are problems, such as the light-emitting layer not emitting unless more holes are transported and light-emitting spots becoming uneven.

Further, as light-emitting characteristics of the organic EL apparatus shown in FIG. 13, there is a characteristic in which a change "de" of efficiency of the longitudinal axis makes a steep change relative to a change "dv" of a drive voltage on the transverse axis. Specifically, slightly increasing the drive voltage results in raising the efficiency greatly, and further, there is another characteristic in which slightly decreasing the drive voltage results in increasing the efficiency largely. Such characteristics are considered to be caused by the fact that since the materials of various light-emitting functional layers are in such a condition that surfaces are evenly in contact with one another on the interfaces of various light-emitting functional layers such as the hall transport layer and the light-emitting layer contact, by increasing a predefined drive voltage level, the holes and the electrons are excited, combined, and emitted all at once. Consequently, there is a problem of difficulty to control the efficiency of the organic EL apparatus. Further, to emit light at the luminance of a desired gradation, a driver circuit and the like to control finely the change "dv" of the drive voltage are needed. This creates another problem of making peripheral circuits complicated.

Aspects of the present invention can provide an organic electro-luminescence apparatus and electronic equipment provided with the organic electro-luminescence apparatus, which can accomplish high efficiency and long life of the light-emitting characteristics as well as facilitate gradation control.

To accomplish the above-mentioned objects, the invention can be employed with the following configuration.

An organic EL apparatus of the invention can be an organic EL apparatus having a light-emitting functional part formed between electrodes. The light-emitting functional part can include a plurality of functional layers, the plurality of functional layers being formed only by phase separation. Further, in the organic EL apparatus, it is preferable for mutual interfaces of the plurality of functional layers to be formed substantially parallel to the electrode. It is preferable, at this point, for each of the plurality of functional layers to be constituted by a polymer material.

Further, to be formed by phase separation as mentioned above can mean that the plurality of functional layers are formed in multi-layers by using a phenomenon in which, when mixed liquid materials obtained by mixing a plurality of liquid materials, which are to serve as the plurality of functional layers, are coated on one electrode, phase separation takes place such that the mixed liquid materials are substantially parallel to the electrode surface to form a phase-separated interface.

Further, substantially parallel as mentioned above can mean the above interface and the electrode surface to be in parallel from a macro-viewpoint, whereas, from a micro-viewpoint, the plurality of functional layers are mingled mutually in concave and convex shapes in the vicinity of the interface. Furthermore, from the micro-viewpoint, the material of each functional layer in the vicinity of the interface inside each functional layer is in a mixed state more than at a part away from the interface.

In this manner, effective results may be obtained by comparison to the case of forming the multi-layered structure of small molecule materials.

To explain specifically, generally, the small molecule material was amorphously formed with an isotropic structure of molecules, so that carrier mobility is the same in the small molecule material in terms of isotropy. And the thickness of each layer of film making up the multi-layered structure was determined such as to provide a good balance of carrier mobility. To form a multi-layer of the small molecule materials, the vacuum evaporation method was typically used. However, the interface of the multi-layered film formed by the small molecule materials was in the state of uniform facial contact without the material of each film mixing. Hence, in such multi-layer structure, unless the voltage was set high in the case of a thick film thickness of the hole transport material so as to transport more holes, no light emission occurred at the light-emitting layer, and further, there were uneven light-emitting spots. And, since the interface of each film was a uniform junction surface, as the drive voltage level slightly increased, the holes and the electrons were excited, combined, and emitted all at once.

On the other hand, in the invention, the phase-separated interface can be formed as the functional layer composed of the polymer material undergoes phase separation, and further, the phase-separated interface and the electrode are substantially parallel to each other from the macro-viewpoint, and from a micro-viewpoint, the plurality of functional layers are mingled mutually in concave and convex shapes. Furthermore, the material of each functional layer in the vicinity of the interface inside each functional layer is in a mixed state more than in a part away from the phase-separated interface.

Consequently, because the interface of the functional layer is in the state in which concave and convex shapes are mingled, a contact area between each functional layer enlarges to widen a recombination site of the electron and the hole. Then, this recombination site exists at a part away from the electrode, and the light-emitting site expands as a result. Namely, improvement of the efficiency and long life of the light-emitting functional part may be accomplished.

Further, since the phase-separated interface is not uniform, but in the concave and convex shapes, even if a certain predefined drive voltage is increased, the holes and the electrons will not get excited and combine all at once, and so the intensity of emitted light will not rise steeply. Therefore, luminance may be increased gradually in response to the drive voltage level, so that control of the efficiency of the organic EL apparatus as well as gradation control low luminance can be easily performed. Furthermore, there is an advantage of dispensing with a need of complicated peripheral circuitry to perform a minute control of changes in the drive voltage.

Moreover, in the organic EL apparatus, the functional layer positioned on the surface side of the electrode has one material as its main component, and it is preferable for the one material to occupy more than 80% of the constituent elements of the functional layer.

At this point, the constituent elements of the functional layer positioned on the surface side of the electrode may be detailed as follows it means that one material occupies more than 80% by volume and that the material of the functional layer in abutment through the phase-separated interface occupies less than 20% by volume. In this manner, one material not only exists inside the above-mentioned functional layer, but one component exists as the main component, while, at the same time, there exists, as a sub-material, the material of the functional layer in abutment through the phase-separated interface, hence, the recombination site of the electron and the hole further expands. Because the recombination site exists at the part away from the electrode, the light-emitting site expands as a result. Namely, the improvement of the efficiency and long life of the light-emitting functional part may be promoted.

Further, in the organic EL apparatus, one of the plurality of functional layers is a hole transport layer having a hole transport material. Also, one of the plurality of functional layers is a light-emitting layer having a light-emitting material. It is preferable for the hole transport material to have a host function to accept the light-emitting material as a guest.

The meaning of the hole transport material has a host function to accept the light-emitting material as a guest herein can be a large overlapping of a distribution of an emission spectrum (emission energy) of the hole transport material on an absorption spectrum of the light-emitting material. In this manner, by establishing a host-guest relationship, energy movement is efficiently performed, so that in the same way as the organic EL apparatus mentioned above, the improvement of the efficiency and long life may be promoted.

It should be noted that in the invention, the hole transport layer can also includes a meaning of a hole injection layer having a hole injection property.

Still further, exemplary electronic equipment of the invention can include the organic EL apparatus mentioned above. This makes it possible to provide the electronic equipment having a long life as well as a bright display.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

An exemplary embodiment according to the invention will be described as follows.

Referring to FIG. 1 to FIG. 10, a fabrication method of an organic EL apparatus corresponding to an exemplary embodiment of the invention will be described. It should be noted that in each drawing, a different scale is used for each layer and each part to present each layer and each part on an recognizable size on the drawings.

Figure 1:
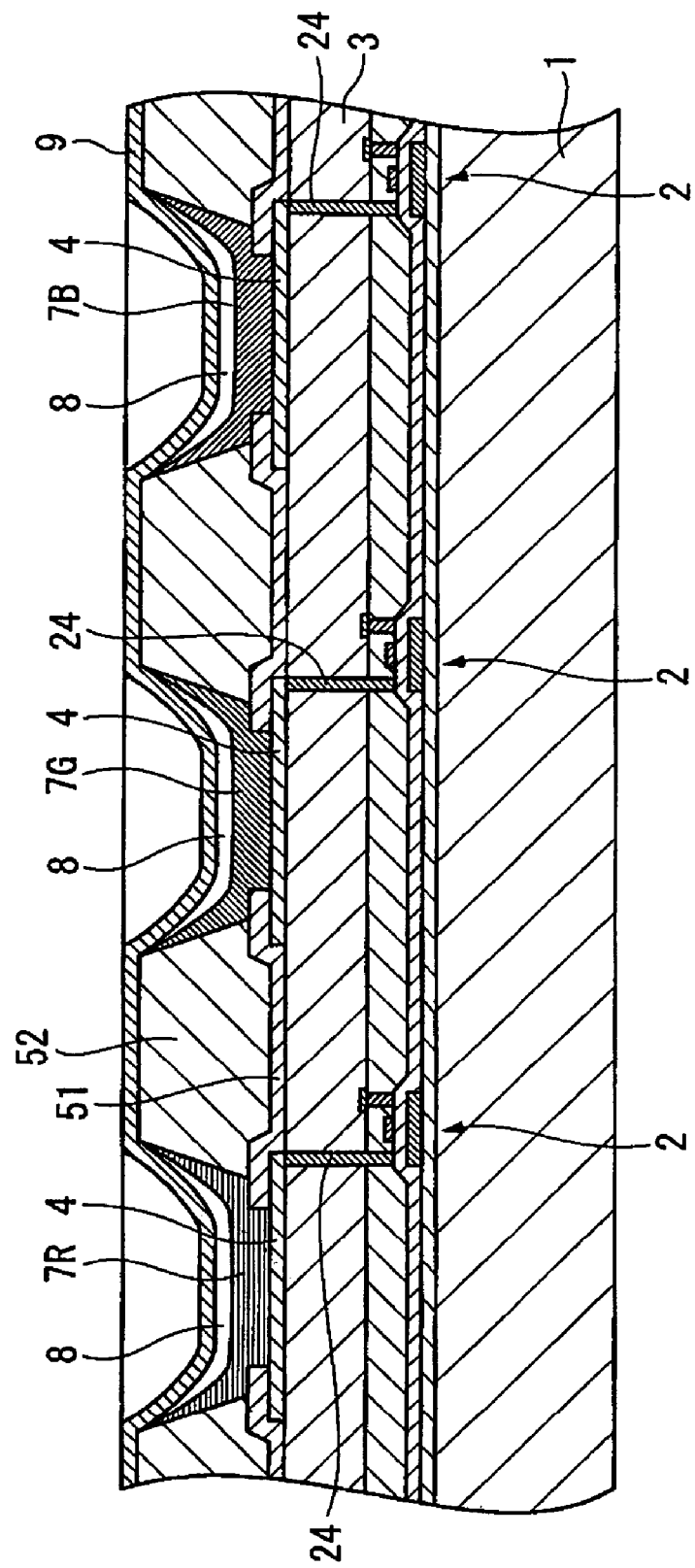
FIG. 1 is a sectional view to show an organic EL apparatus fabricated by a method of an embodiment according to the invention.

The organic EL apparatus to be fabricated herein is a color organic EL apparatus. Its sectional view can include, as shown in FIG. 1, many pieces of a red light-emitting functional section 7R, a green light-emitting functional section 7G, a blue light-emitting functional section 7B as respective pixels at pre-defined positions inside the substrate surface.

Figure 2:
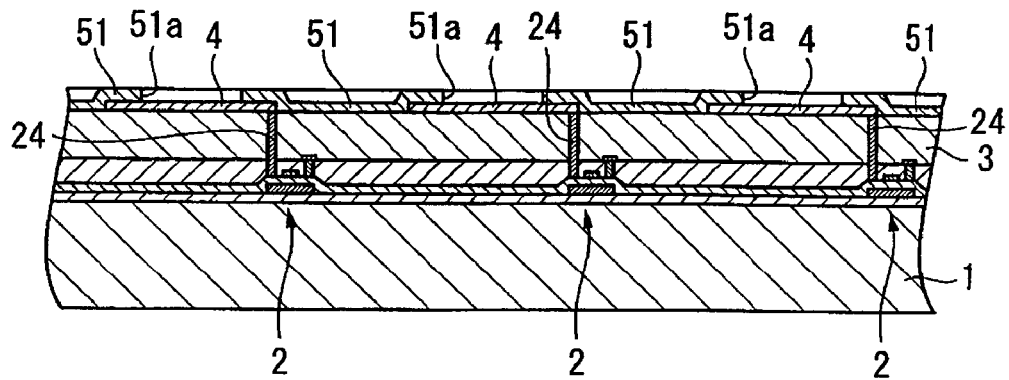
FIG. 2 is a sectional view to explain a fabrication process of an organic EL apparatus in FIG. 1.

First, as shown in FIG. 2, after a thin-film transistor 2 of each pixel was formed on a glass substrate 1, an insulating layer 3 was formed. Next, a wiring 24 was formed on this insulating layer 3 to connect a thin-film transistor 2 for each pixel and an anode (pixel electrode, electrode) to the insulating layer 3. Then, formation of the anode 4 consisting of ITO (In$_2$O$_3$—SnO$_2$) for each pixel position was carried out by using a typical ITO thin-film formation process, a photolithography process, and an etching process. By this, the anode 4 consisting of ITO was formed at each pixel position on the glass substrate 1 after the formation of the wiring 24.

Next, on this glass substrate 1, a first bulkhead 51 made of silicon oxide having an opening 51a corresponding to each light-emitting area was formed by the typical silicon oxide thin-film formation process, the photolithography process, and the etching process. FIG. 2 shows this condition. The first bulkhead 51 is formed such that a periphery of the opening 51a overlaps a periphery of the anode 4.

Figure 3:
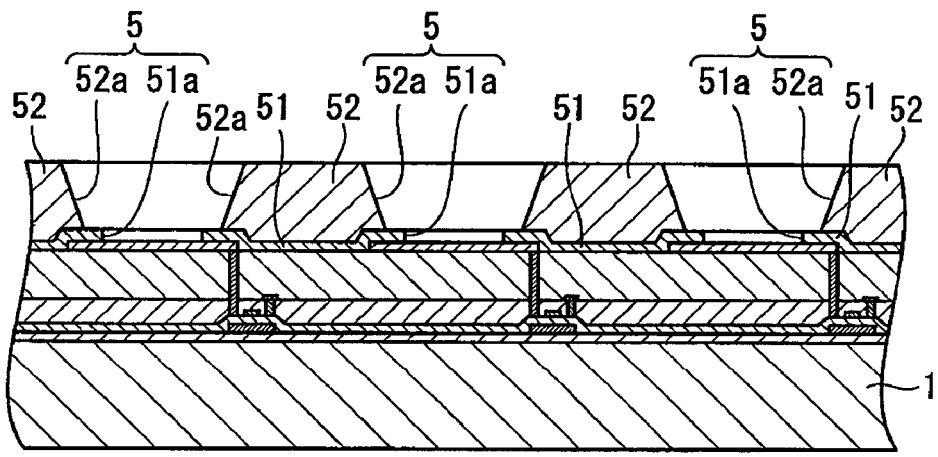
FIG. 3 is a sectional view to explain a fabrication process of an organic EL apparatus in FIG. 1.

Next, as shown in FIG. 3, on the first bulkhead 51, there was formed a second bulkhead 52 having an opening 52a corresponding to each light-emitting area. This second bulkhead 52 was made of a polyamide resin and formed by a coating process of a solvent containing the polyamide resin, a drying process of a coated film, the photolithography process, and the etching process.

The opening 52a of the second bulkhead 52 was formed in such a tapered fashion that a section perpendicular to a substrate surface is small on the glass substrate 1 side and grows larger towards a side away from the glass substrate 1. Also, an opening area of the opening 52a of the second bulkhead 52 is larger than the opening 51a of the first bulkhead 51 at a position on the glass substrate 1 side. This enabled a bulkhead having an opening 5 of a two-tiered structure to be formed.

It should be noted that the light-emitting area of each pixel is precision controlled by the opening 52a of the second bulkhead 52. Also, the second bulkhead 52 is in a predefined thickness to secure a depth of the opening 5. Also, it is formed in a tapered fashion so that even if the solvent dropped is on an upper surface of the bulkhead 52, entering the opening 5 is facilitated.

Figure 4:
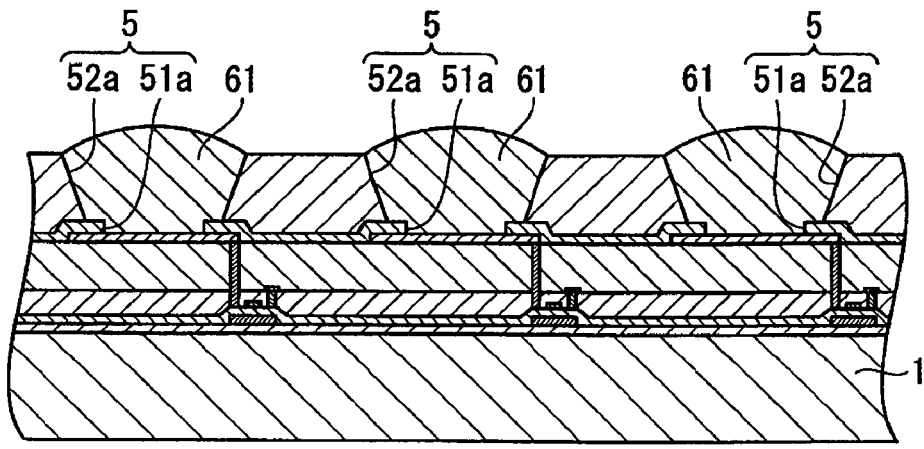
FIG. 4 is a sectional view to explain a fabrication process of an organic EL apparatus in FIG. 1.

Next, as shown in FIG. 4, a light-emitting functional part forming material 61 is coated and formed inside each opening 5.

As coating methods of the light-emitting functional part forming material 61, a known wet process (wet coating process) can be employed. For example, an inkjet process (droplet discharge), a spin coating process, a slit coat process, a dip coat process, a spray film-forming method, a printing process and the like may be used. Such processes are suitable methods for film-making of polymer materials. As compared to the vapor phase process, without using expensive equipment such as vacuum apparatus, it is possible to fabricate the organic EL apparatus at low cost.

In the exemplary embodiment, it is preferable to use the spin coating process. By using the wet process in this way, the light-emitting functional part forming material 61 is formed on each pixel electrode 4 inside each opening 5.

The light-emitting functional part forming material will now be described in detail. The light-emitting functional part forming material can be a material for forming a part corresponding to a light-emitting functional part of the present invention, and further, it has a mixture of a hole transport material to form the hole transport layer (functional layer) and a light-emitting material to form the light emitting layer (functional layer) which is dissolved by the solvent.

Next, specific examples of the hole transport material, the light-emitting material, and the solvent will e described.

First, as the hole transport material, it is preferable to employ a polymer material having triphenylamine as a skeleton. In the exemplary embodiment, ADS254BE made by ADS shown below as Compound 1 is used.

Further, as the light-emitting material, there may be used poly(9-vinylcarbazole), polyofluorene polymer derivative, (poly-)p-phenylenevinylene derivative, polyphenylene derivative, olythiophen derivative, perylene pigment, coumalin pigment, rhodamine pigment, or the above-mentioned polymer doped with an organic EL material. For doping materials, for example, there may be cited rubrene, perylene, 9,10-diphenylanthracene, tetraphenylbutadiene, Nile red, coumarin 6, quinacridone and the like.

Compound 1

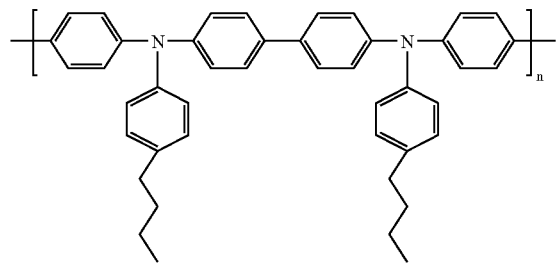

Compound 2

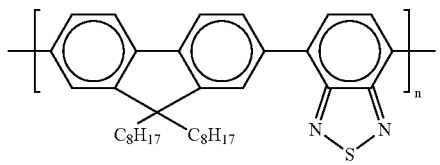

Compound 3

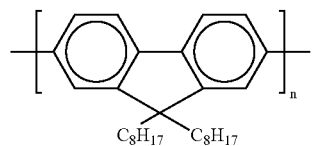

Compound 4

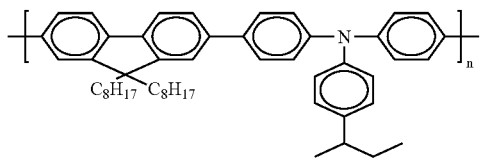

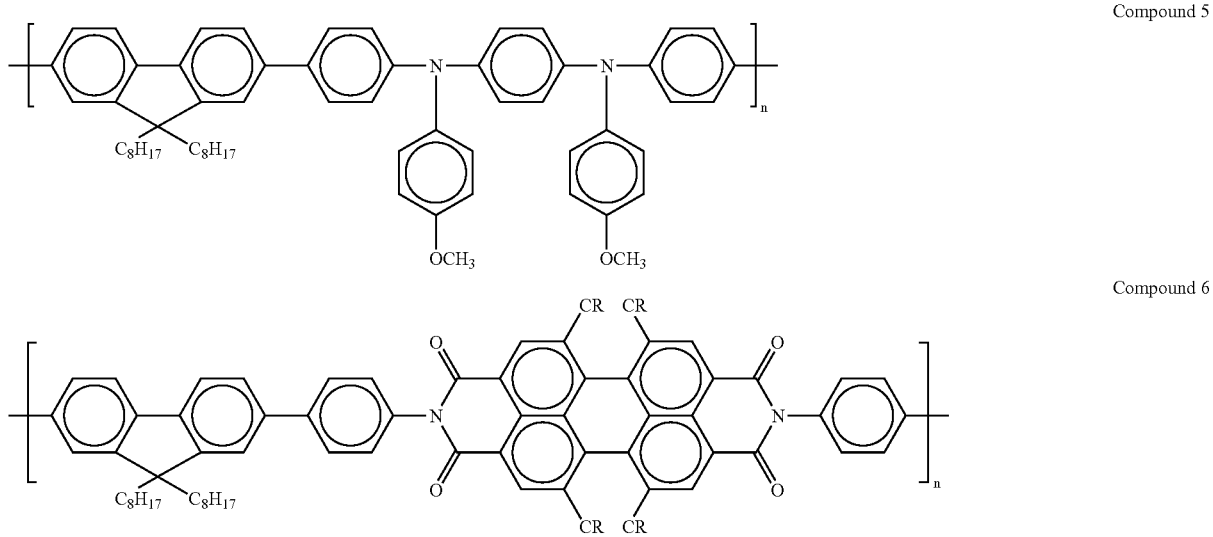

Compound 5

Compound 6

As regards the molecular weight of polymer materials which serve as the hole transport material and the light-emitting material, it is preferably less than 200,000, and particularly under 10.

Furthermore, it is possible to use as the red light-emitting material, for example, MEH-PPV poly[2-methoxy-5-(2-ethyl hexyloxy)-p-phenylenevinylene]; as the blue light-emitting material, for example, poly(9,9-dioethylfluorene); and as the green light-emitting material, for example, PPV (poly(p-phenylenevinylene)).

Moreover, as the solvent to dissolve the above-mentioned hole transport material and light-emitting material, it is preferable to adopt xylene. It should be noted that solvents other than xylene may very well be used, for example, cyclohexylbenzene, dihydrobenzofuran, trimethylbenzene, and tetramethylbenzene.

And, since the hole transport material and the light-emitting material are formed through phase separation (to be explained later) in such light-emitting functional part forming materials, molecular weight reduction is applied to the hole transport material. As a method of applying molecular weight reduction, a high pressure homogenizer system or an ultrasonic system is used. In the exemplary embodiment, the homogenizer system will be described.

The high pressure homogenizer system can be performed by using a high pressure pump equipped with a homo valve capable of adjusting an watercourse interval. This system may be explained roughly as follows. While the high pressure pump is in a condition of applying high homogeneous pressure against a matter subject to processing (hole transport material), the homo valve squeezes a flow of the matter subject to process, and by spurting it out through a minute gap, the matter subject to process is homogenized. In this way, by homogenizing the matter subject to process, there are obtained respective operations/working-effects of (1) shearing action accompanying an ultra high speed flow, (2) fine powder-making action arising from impacting a breaker ring, (3) a cavitation phenomenon caused by an ultra high speed fluid as accelerated at the homo valve gap when pressure is reduced from high pressure to low pressure, and (4) breaking action due to drastic acceleration and deceleration of the flow of the matter subject to process.

Further, as equipment to perform the high pressure homogenizer system, L-01 made by Sanwa Machinery may be used. Next, a specific example may be described. First, xylene is used as a link up to a pressure increase. After the pressure reaches 160 MPa (±20 MPa), the matter subject to process is charged. After charging approx. 50 ml of the matter subject to process, about 25 ml is recovered at 150 MPa, and further continuously adjusted to 100 MPa (±20 MPa), the remaining 25 ml is recovered.

Each pass frequency is one time.

By using the high pressure homogenizer system this way, it becomes possible to reduce the molecular weight of the hole transport material to about 10,000, and when the hole transport material is mixed with the light-emitting material and coated, phase separation suitably and easily occurs. It should be noted that the hole transport material and the light-emitting material are mixed in the light-emitting functional part forming material such that its mix ratio is 1:2 by weight. Further, in the present embodiment, it is preferable for the hole transport material to have a host function having the light-emitting material as a guest.

Figure 9:
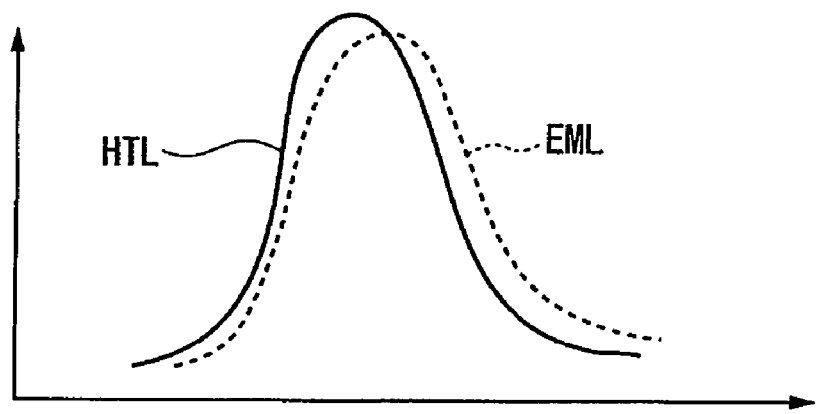
FIG. 9 is a diagram to explain a host-guest function.

Referring to FIG. 9, a host-guest relationship between the hole transport material and the light-emitting material will be described. In the drawing, solid lines showing reference numeral HTL indicate a distribution of emission spectrum of the hole transport material and broken lines showing reference numeral EML indicate a distribution of the absorption spectrum of the light-emitting material.

As shown in FIG. 9 the hole transport material has a host function to accept the light-emitting material as a guest can mean that there is a considerable overlapping of the distribution of the emission spectrum HTL of the hole transport material on the distribution of the absorption spectrum EML of the light-emitting material as a guest.

Figure 5:
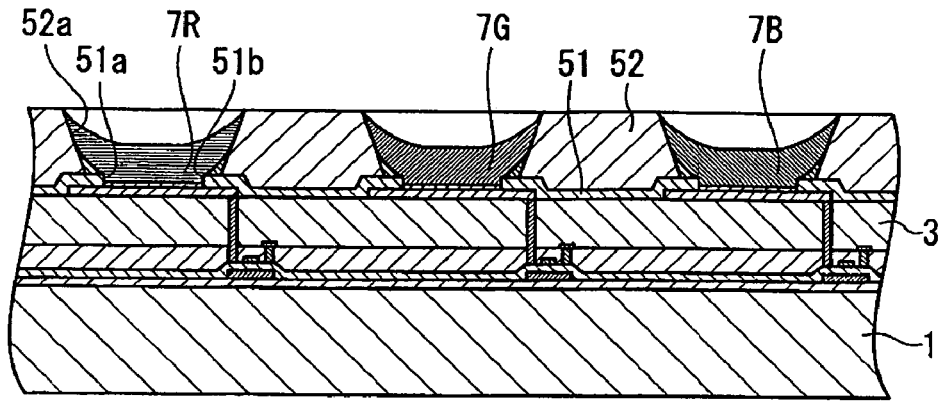
FIG. 5 is a sectional view to explain a fabrication process of an organic EL apparatus in FIG. 1.

FIG. 5 is a diagram showing a state in which a solvent contained in the light-emitting functional part forming material has completely evaporated after the coating and formation of the light-emitting functional part forming material. As shown in the drawing, the light-emitting section of each color 7R, 7G, and 7B is formed on each pixel electrode 4.

Figure 10:
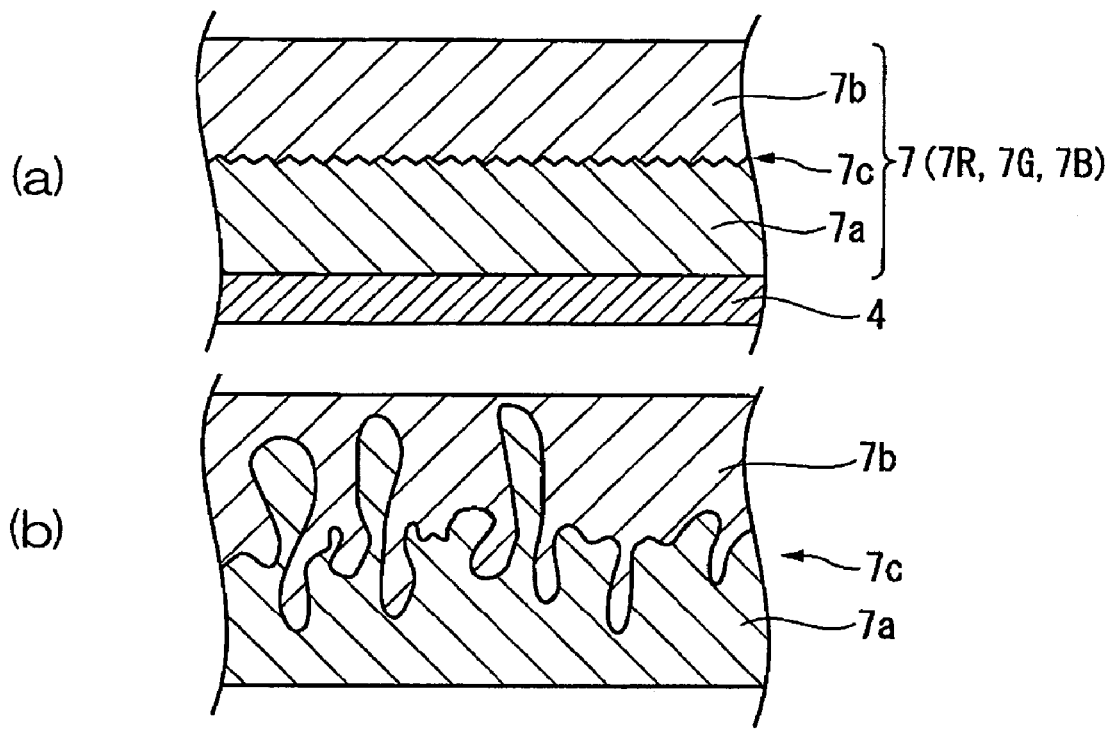
FIG. 10 is a diagram to explain a detailed configuration of a light-emitting functional part.

At this point, referring to FIG. 10, a detailed configuration of the light-emitting section 7 will be explained. FIG. 10A is a sectional view in macro terms of the principal part of the light-emitting section 7 and FIG. 10B is a sectional view in micro terms of the principal part of the light-emitting section 7.

As shown in FIG. 10A, the light-emitting section 7 (7R, 7G, and 7B) is formed on the anode 4, the hole transport layer (functional layer) 7a is disposed on the anode 4 side, and the light-emitting layer (functional layer) 7b is disposed on the hole transport layer 7a. When the above-mentioned light-emitting functional part forming material was coated and formed, phase separation occurred and it was separated by a phase-separated surface 7c and disposed as the hole transport layer 7a and the light-emitting layer 7b. The phase-separated surface 7c is formed substantially parallel to the anode surface.

Further, as shown in FIG. 10B, when the phase-separated surface 7c is viewed in micro terms, the hole transport layer 7a and the light-emitting layer 7b are in a condition such that they are mutually mixed together in concave and convex shapes. Still further, at each layer of the hole transport layer 7a and the light-emitting layer 7b in the vicinity of the phase-separated surface 7c, the material of each functional layer is in the condition of being mixed in more quantities than a part away from the phase-separated interface 7c. To describe specifically by taking the hole transport layer 7a as an example, in the vicinity of the phase-separated interface 7c inside the hole transport layer 7a, for instance, the hole transport layer and the light-emitting layer are mixed in relatively large quantities, while in the vicinity of the anode 4 away from the phase-separated interface 7c, the condition is for the hole transport layer and the light-emitting layer to be scarcely mixed. Furthermore, in the same way, in the vicinity of the phase-separated interface 7c inside the light-emitting layer 7b, for instance, the hole transport layer and the light-emitting layer are mixed in relatively large quantities, while at the upper part (the first cathode side to be explained later) of the light-emitting layer 7b away from the phase-separated interface 7c, the condition is for the hole transport layer and the light-emitting layer to be scarcely mixed.

And the ratio of components of the material constituting the hole transport layer 7a may be described as the hole transport material occupying over 80% by volume thereof, while the light-emitting material occupies under 20% by volume of the remainder. Also, the ratio of components of the material constituting the light-emitting layer 7a may be described as the light-emitting material occupying over 80% by volume thereof, while the hole transport material occupies under 20% by volume of the remainder.

Figure 6:
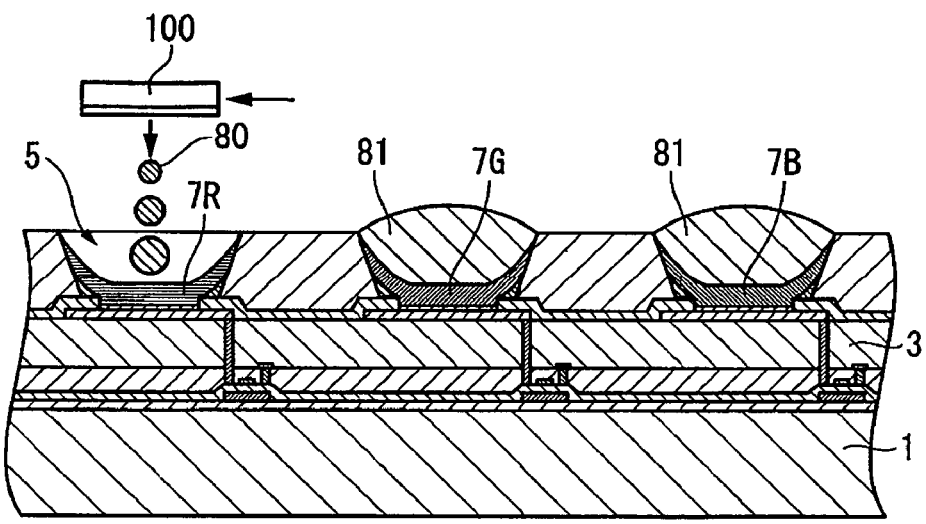
FIG. 6 is a sectional view to explain a fabrication process of an organic EL apparatus in FIG. 1.
Figure 8:
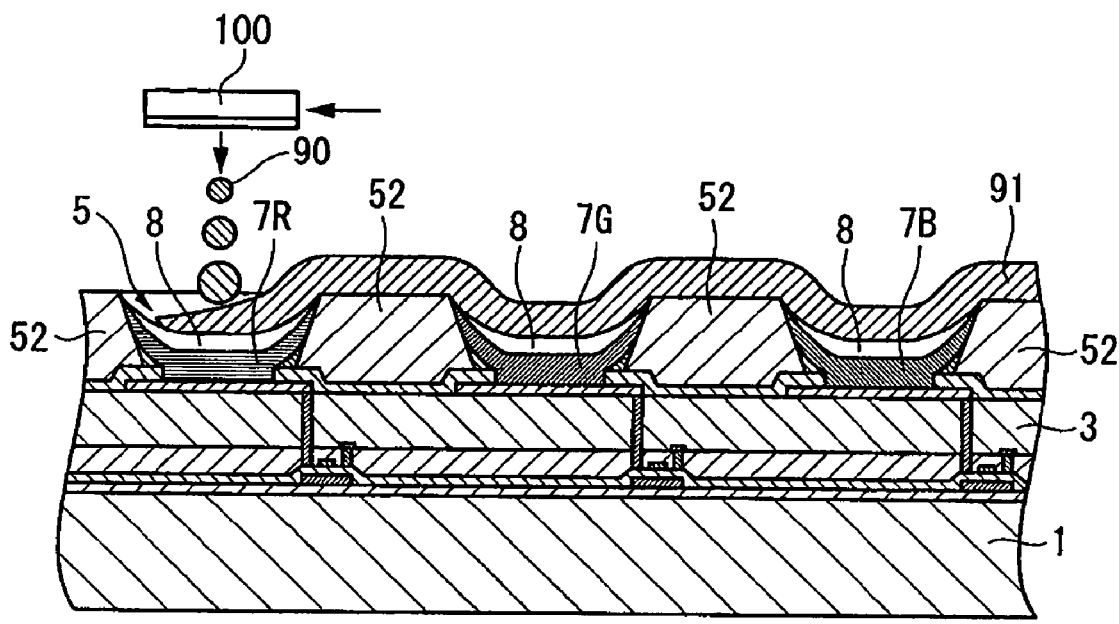
FIG. 8 is a sectional view to explain a fabrication process of an organic EL apparatus in FIG. 1.

As shown in FIG. 6, from directly above each opening 5, a dispersed liquid 80 of ultra minute particles (average particle diameter: over 1 nm under 100 nm) of ytterbium (Yb) is dripped by the inkjet process (droplet discharge) towards the light-emitting functional section of each color, 7R, 7G, and 7B. Reference numeral 100 of FIG. 8 shows an inkjet head. This enables a droplet 81 consisting of the above-mentioned dispersed liquid to be formed on each light-emitting functional section 7R, 7G, and 7B.

The inkjet process is a color printing technique well known in the so-called inkjet printer. A liquid droplet of a material ink, in which various materials are made into a liquid form, is ejected from the inkjet onto a transparent substrate and fixed. According to the droplet discharge method, since droplets of the material ink may be accurately ejected to a minute area, the material ink may be fixed directly on a desired area to be colored without performing photolithography. Hence, no waste of the material is generated and fabrication cost is reduced, thus making itself a very rational method.

The ultra minute particles of ytterbium may be obtained by the following method (solvent trap process) according to the in-gas evaporation method. Under a condition of a helium pressure of 0.5 Torr, ytterbium is evaporated, and the ultra micro particles of ytterbium during the generation process are brought into contact with a vapor of tri decan and cooled. By this, there is obtained a dispersed liquid in which the ultra micro particles of ytterbium are dispersed in tri decan. This dispersed liquid may be used as the above-mentioned dispersed liquid 80.

Next, by carrying out the drying process, the solvent was evaporated from the liquid droplet 81. This drying process may be performed, for example, by maintaining 150° C. in an inert gas atmosphere. By this, as shown in FIG. 7, a cathode layer (first cathode, electrode) 8 consisting of ytterbium is formed on each light-emitting functional section 7R, 7G, and 7B.

Figure 7:
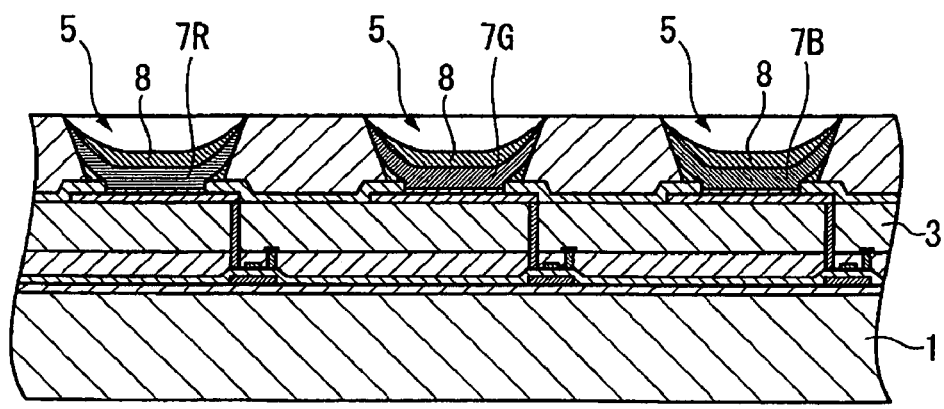
FIG. 7 is a sectional view to explain a fabrication process of an organic EL apparatus in FIG. 1.

Next, as shown in FIG. 8, on the entire surface of the substrate 1 under the condition of FIG. 7, a dispersed liquid 90 of conductive micro particles was dripped by the inkjet process. As this dispersed liquid 90, a dispersed liquid containing micro particles of gold or silver may be used. Specifically, there may be cited Perfect Gold (product name) made by Vacuum Metallurgy Co. Ltd. and a dispersed liquid of ultra micro particles of silver obtained by adding a water solution of sodium citrate to a water solution of silver nitrate. Reference numeral 100 of FIG. 8 shows the inkjet head. By this, a liquid layer 91 consisting of the above-mentioned dispersed liquid is formed on the first cathode layer 8 inside each opening 5 and on the second bulkhead 52.

Next, the solvent was evaporated from the liquid layer by performing the drying process. By this means, as shown in FIG. 1, the second cathode (electrode) is formed on the entire surface (that is, on the first cathode 8 inside the opening 5 and on the second bulkhead 52) of the substrate 1.

Next, on the entire surface of the substrate 1 and on the outside of the second bulkhead 52 at the periphery position of the substrate surface, an epoxy resin adhesive was coated at a pre-defined thickness, and this adhesive was hardened in a condition of a glass plate being placed thereon. Namely, the entire surface of the second cathode 9 was covered with the epoxy resin adhesive. In this manner, by performing sealing with a sealant and the glass plate, the organic EL apparatus is completed.

And attaching the organic EL apparatus to the body having the drive circuit and the like, there is completed an organic EL display panel equipped with the organic EL apparatus.

Next, the light-emitting characteristic of the above-mentioned organic EL apparatus will be described with reference to FIG. 11.

Figure 11:
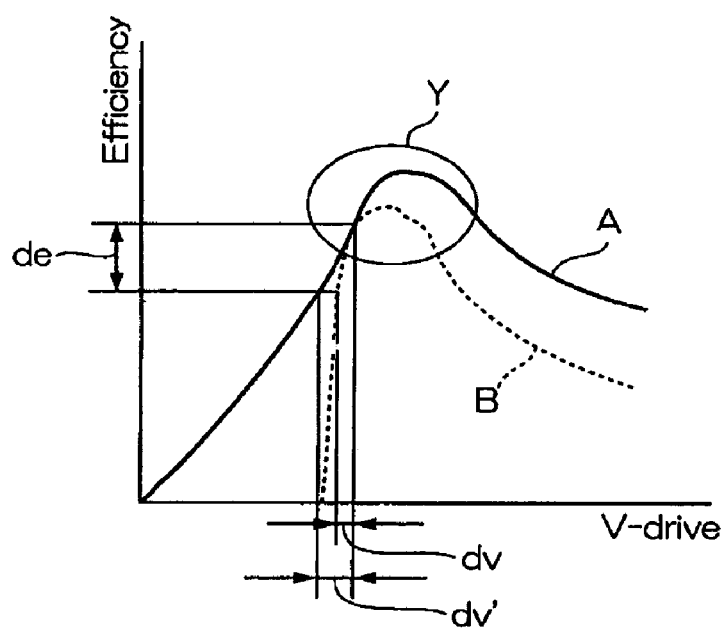
FIG. 11 is a diagram to explain light-emitting characteristics of an organic EL apparatus according to the invention.

FIG. 11 is a diagram showing a result of an experiment on the light-emitting characteristics of the organic EL apparatus, with the drive voltage (V-drive) on the transverse axis and the efficiency on the longitudinal axis.

In this diagram, a curve shown in reference numeral indicates the light-emitting characteristics of an organic EL apparatus (hereinafter referred to as phase-separated structure A) formed through phase separation of the above-mentioned hole transport layer 7a and the light-emitting layer 7b via the phase-separated interface 7c, while a curve shown in reference numeral B indicates the light-emitting characteristics of an organic EL apparatus (hereinafter referred to as the conventional structure B) formed in the multi-layered structure of the hole transport material and the light-emitting material in the same way as the conventional technology.

As shown in FIG. 11, the conventional structure B has a characteristic in which the change "de" of the efficiency relative to the change "dv" of the drive voltage undergoes a steep change. Specifically, there are characteristics in which increasing the drive voltage only slightly causes the efficiency to rise greatly and reducing the drive voltage only slightly causes the efficiency to exteriorize to a large degree.

On the other hand, the phase-separated structure A is a curve milder than the characteristic curve of the conventional structure B, and it is apparent that in the phase-separated structure A, by the change "dv'" which has a larger voltage width than the above-mentioned change "dv", there is obtained the change "de" of the efficiency. Consequently, in the phase-separated structure A, it is possible to change the efficiency without supplying the drive voltage in high precision and in high resolution, and apparently, it is possible to carry out gradation easily in low luminance.

Further, there was obtained a result that the maximum efficiency of the phase-separated structure A is higher than the conventional structure (refer to Y part in the drawing). Still further, in high voltage, a level of decrease of the efficiency in the phase-separated structure A is small, thus suggesting an expansion of the light-emitting position.

As mentioned above, in the organic EL apparatus of the present embodiment, since the hole transport layer 7a and the light-emitting layer 7b are formed through the phase-separated interface 7c, as a contact area between the hole transport layer 7a and the light-emitting layer 7b enlarges, the recombination site of the electron and the hole expands, whereas this recombination site exists in the part away from the electrode, so that the light-emitting site expands. Namely, the improvement of the efficiency and long life of the light-emitting functional part may be accomplished.

And, because the phase-separated interface 7c is not a uniform plane but in concave and convex shapes, even if a pre-defined voltage should be raised, the hole and the electron do not get excited and combine all at once, the intensity of light emitted does not make a steep rise. Consequently, depending on the drive voltage, luminance can be slowly increased, thus making it possible to control easily the efficiency of the organic EL apparatus as well as gradation of low luminance. In addition, there is an advantage of dispensing with complicated peripheral circuitry to control finely the change of the drive voltage.

Further, in the above-mentioned organic EL apparatus, the hole transport layer 7a occupies over 80% by volume of the constituent components with the hole transport material as its main component. Furthermore, the light-emitting layer 7a positioned on the first cathode 8 side has the light-emitting material as its main component, occupying over 80% by volume of the constituent components.

Accordingly, only one material not exist in each layer, but one material exists as the main component, while, at the same time, the material of a layer in abutment through the phase-separated interface exists as a sub-material, hence, the recombination site of the electron and the hole expands even further; since the recombination site exists at a part away from the electrode, the light-emitting site expands as a result. Namely, the improvement of the efficiency and long life of the light-emitting functional part may be accomplished.

Further, in the above-mentioned organic EL apparatus, the hole transport layer 7a has the host function for treating the light-emitting material as a guest, resulting in enlarging an overlapping of the distribution of the emission spectrum of the hole transport layer 7a on the absorption spectrum of the light-emitting material; by establishing the host-guest relationship, energy movement is efficiently performed, thereby further contributing to the improvement of the efficiency and long life.

Still further, since the wet process is used to form the light-emitting functional section 7, the photolithography process becomes unnecessary. Consequently, reduction of the fabrication cost is made, thus providing a very rational method and enabling the light-emitting functional section 7 to be formed at low cost and with accuracy.

Furthermore, by using the inkjet process, the first cathode 8 and the second cathode 9 are formed. Consequently, it is possible to form the light-emitting functional section 7, the first cathode 8, and the second cathode 9 all by the wet process. Accordingly, expensive equipment, such as vacuum equipment becomes unnecessary, simplification of the production process is accomplished, and inexpensive organic EL apparatus may be fabricated.

It should be noted that by using the light-emitting functional part forming material which mixed the hole transport material and the light-emitting material, there is produced a configuration in which the hole transport layer 7a and the light-emitting layer 7b are formed through the phase-separated interface 7c. An electron injection material may be further mixed in the light-emitting functional part forming material. In this manner, when the light-emitting functional part is formed by using the light-emitting functional part forming material in which the electron injection material is further injected, configuration will be such that the first phase-separated interface 7c is formed between the hole transport layer 7a and the light-emitting layer 7b and that a second phase-separated interface is formed between the light-emitting layer 7b and the electron transport layer. In such configuration, there is made available an organic EL apparatus of not only hole transportability but also electron injectability.

Figure 12:
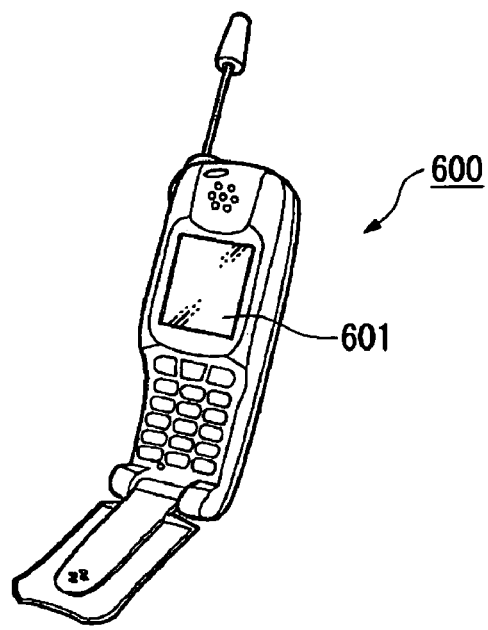
FIG. 12 is a perspective view to show electronic equipment provided with an organic EL apparatus according to the invention.
Figure 12:
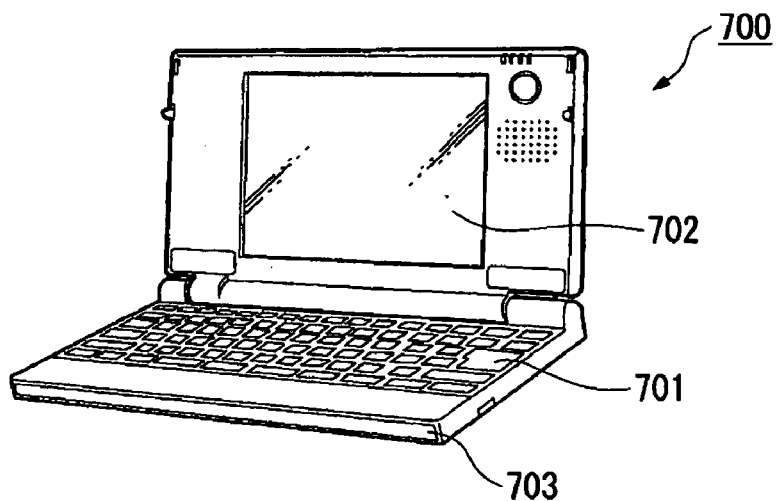
Figure 12:
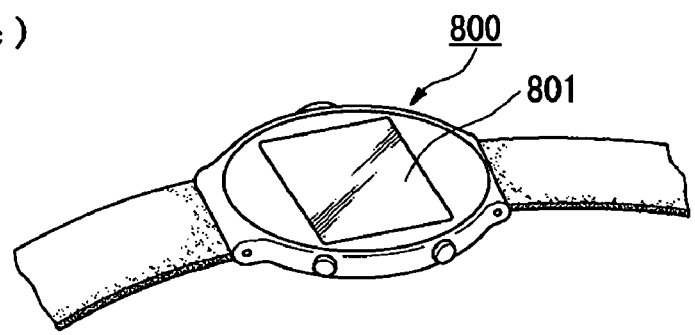
Figure 13:
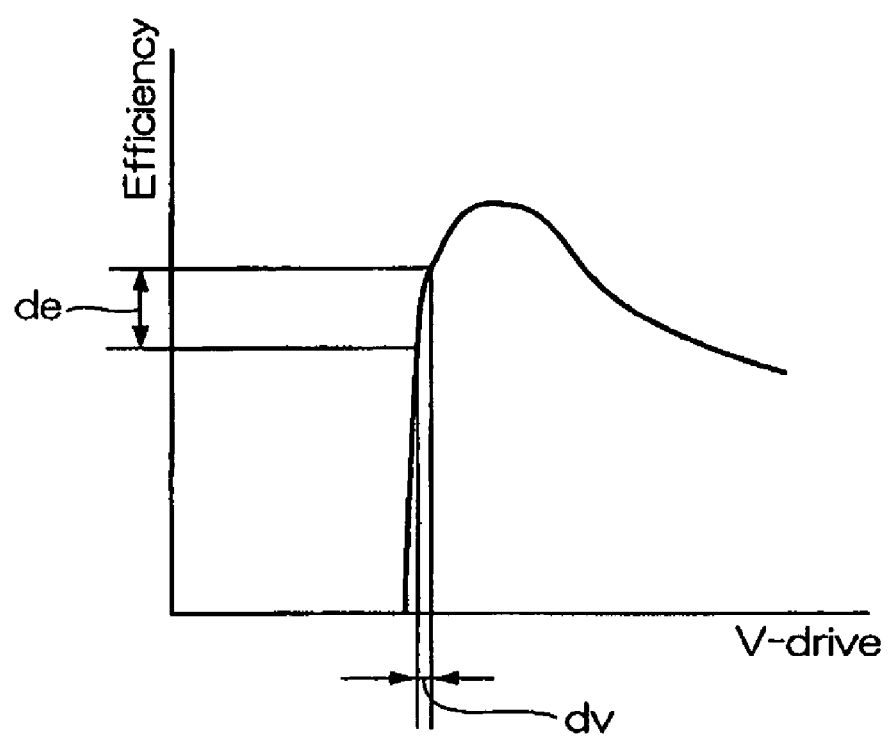
FIG. 13 is a diagram to explain the light-emitting characteristics of a conventional organic EL apparatus.

Next, various exemplary electronic equipment provided with the organic EL apparatus of the present invention will be described with reference to FIG. 12.

FIG. 12A is a perspective view showing an example of a mobile phone. Reference numeral 600 in FIG. 12A shows the mobile phone body, while reference numeral 601 shows a display unit using the above-mentioned organic EL apparatus.

FIG. 12B is a perspective view showing an example of a portable information processing device such as a word processor and a personal computer. Reference numeral 700 in FIG. 12B shows a portable information device, reference numeral 701 shows an input section such as a keyboard, reference numeral 703 shows an information processing device body, and reference numeral 702 shows a display unit using the above-mentioned organic EL apparatus.

FIG. 12C is a perspective view showing an example of wrist watch type electronic equipment. Reference numeral 800 in FIG. 12C shows a watch body, and reference numeral 801 shows a display unit using the above-mentioned organic EL apparatus.

Each electronic equipment shown in FIG. 12A to C is that which is provided with the organic EL apparatus, which was fabricated by a method of the above-mentioned embodiment, as a display unit, featuring the characteristics of the fabrication method of the organic EL apparatus according to the above-mentioned embodiment. As a result, the fabrication methods of these electronic equipment are made easy.

It should be noted that in the above-mentioned exemplary embodiment, the cathode layer consisting of ytterbium is formed by the liquid process using the dispersed liquid of ultra minute particles of ytterbium. It should be understood that the method of the invention is not restricted to such a method using the dispersed liquid of ultra minute particles of a rare earth element, and, for example, there is included a method of processing to remove a ligand of a rare earth element complex after a liquid containing the rare earth element is dripped by the inkjet process and the like.

Further, in the above-mentioned exemplary embodiment, the organic EL apparatus was described, whereas it may be applicable to organic EL apparatus other than a display unit, for example, a source of light. Still further, in regard to materials making up constituent parts other than the cathode of the organic EL apparatus, those publicly known, conventional materials may be used.

What is claimed is:

1. An organic electroluminescence apparatus, comprising:
    a first functional layer having a first function;
    a second functional layer having a second function;
    a first electrode; and
    a second electrode,
    the first functional layer and the second functional layer being disposed between the first electrode and the second electrode,
    a first material included in the first functional layer playing a role in the first function,
    a second material included in the second layer playing a role in the second function,
    a percent by volume of the second material at a first part of the first functional layer at a first distance from a position where the first functional layer contacts the second functional layer is higher than a percent by volume of the second material in a second part of the first functional layer at a second distance from the position where the first functional layer contacts the second functional layer, the second distance being longer than the first distance.

2. The organic electro-luminescence apparatus according to claim 1, an interface between the first functional layer and the second functional layer having concave and convex shapes.

3. The organic electro-luminescence apparatus according to claim 1, the first function including a light emitting function.

4. The organic electro-luminescence apparatus according to claim 1, the second function including a hole transport function.

5. The organic electro-luminescence apparatus according to claim 1, wherein the first functional layer and the second functional layer are formed by a phase separation between the first material and the second material.

6. The organic electro-luminescence apparatus according to claim 5, the phase separation occurring by applying a solution including the first material and the second material to the first electrode.

7. The organic electro-luminescence apparatus according to claim 1, an interface of the first functional layer being substantially parallel to the first electrode.

8. The organic electro-luminescence apparatus according to claim 1, the first material in the first functional layer being more than 80% by volume of the first functional layer.

9. The organic electro-luminescence apparatus according to claim 1, the second material in the second functional layer being more than 80% by volume of the second functional layer.

10. The organic electro-luminescence apparatus according to claim 1,
    the first material functioning as a light emitting material in the first functional layer,
    the second material functioning as a hole transport material in the first functional layer, and
    the second material having a host function which treats the first material in the first functional layer as a guest.

11. Electronic equipment, comprising:
    an organic electro-luminescence apparatus according to claim 1.

12. An organic electro-luminescence apparatus comprising:
    a first functional layer having a first function;
    a second functional layer having a second function;
    a first electrode; and
    a second electrode,
    the first functional layer and the second functional layer being disposed between the first electrode and the second electrode,
    a first material included in the first functional layer playing a role in the first function,
    a second material included in the second layer playing a role in the second function, and
    an interface between the first functional layer and the second functional layer having concave and convex shapes.

13. The organic electro-luminescence apparatus according to claim 12, the first function including a light emitting function.

14. The organic electro-luminescence apparatus according to claim 12, the second function including a hole transport function.

15. The organic electro-luminescence apparatus according to claim 12, wherein the first functional layer and the second functional layer are formed by a phase separation between the first material and the second material.

16. The organic electro-luminescence apparatus according to claim 15, the phase separation occurring by applying a solution including the first material and the second material to the first electrode.

17. The organic electro-luminescence apparatus according to claim 12, an interface of the first functional layers being substantially parallel to the first electrode.

18. The organic electro-luminescence apparatus according to claim 12, the first material in the first functional layer being more than 80% by volume of the first functional layer.

19. The organic electro-luminescence apparatus according to claim 12, the second material in the second functional layer being more than 80% by volume of the second functional layer.

20. The organic electro-luminescence apparatus according to claim 12,
    the first material functioning as a light emitting material in the first functional layer,
    the second material functioning as a hole transport material in the first functional layer, and
    the second material having a host function which treats the first material in the first functional layer as a guest.

21. Electronic equipment, comprising:
    an organic electro-luminescence apparatus according to claim 12.

* * * * *